Dec. 16, 1969 V. P. HONEISER 3,484,654

HIGH-SPEED PRINTING OF ELECTRONIC COMPONENTS AND ARTICLES PRODUCED THEREBY

Filed March 24, 1967 4 Sheets-Sheet 1

INVENTOR.
VLADIMIR PAUL HONEISER

BY

ATTORNEY

Dec. 16, 1969 V. P. HONEISER 3,484,654

HIGH-SPEED PRINTING OF ELECTRONIC COMPONENTS AND ARTICLES PRODUCED THEREBY

Filed March 24, 1967 4 Sheets-Sheet 2

INVENTOR.
VLADIMIR PAUL HONEISER

BY [signature]

ATTORNEY

INVENTOR.
VLADIMIR PAUL HONEISER
BY
ATTORNEY

INVENTOR.
VLADIMIR PAUL HONEISER

BY [signature]
ATTORNEY

United States Patent Office 3,484,654 Patented Dec. 16, 1969

3,484,654

HIGH-SPEED PRINTING OF ELECTRONIC COMPONENTS AND ARTICLES PRODUCED THEREBY

Vladimir Paul Honeiser, Lawrenceville, N.J., assignor to American Can Company, New York, N.Y., a corporation of New Jersey Filed Mar. 24, 1967, Ser. No. 625,810
Int. Cl. H02b *1/04, 9/00;* H01g *1/00*
U.S. Cl. 317—101 4 Claims

ABSTRACT OF THE DISCLOSURE

Electronic components and their conductive terminals and connections are produced by utilizing conventional high-speed letterpress, gravure, and flexographic printing equipment to print individual layers having the desired dielectric, resistive, and conductive electrical characteristics to form simple and complex electronic components and circuitry. The circuitry produced has multi-layered structures wherein each layer contributes particular electrical characteristics to the overall electrical character, particularly in capacitive components and networks.

BACKGROUND OF THE INVENTION

The present invention relates to generating electronic components through the application of printing techniques performed by conventional high-speed printing equipment such as letterpress, gravure, and flexography.

The production of electronic components through the application of thin film or thick-film technologies are well-known in the art. In this art, heretofore, the films are deposited upon a substrate under high-vacuum conditions. This process for producing film components requires high-cost production equipment, precise control systems, and trained chemists an engineers to supervise production. The initial and operating costs of the process are extremely high. Furthermore, due to the minute dimensions of the resulting components, final assembly operations are intricate and costly. Design changes in the components or circuits are not readily accomplished since such changes generally require a new set of masks. The preparation of such masks, having precision characteristics, is an extremely tedious and costly process. The isolation of components from each other is generally achieved through oxidation methods involving a complex arrangement of such masks. Furthermore, capacitors and diodes are produced through such complex operations as diffusion and epitaxial growth. In order that these latter two processes be successful, they require highly experienced and skilled personnel since the modification and growth of crystal structures are involved.

In another method, thick films are produced by silk-screen printing techniques which are relatively slow. The films generally are fired at high temperatures. Film thickness cannot be controlled as accurately as with vacuum technology. Due to cost of substrate, multiple handling, and the slow printing method, the end product is about as expensive as that made by vacuum deposition techniques.

Accordingly, it is an object of the present invention to provide a method for producing economically, electronic components and circuits through the application of conventional high-speed printing equipment as, for example, flexographic, rotogravure, and letterpress machines.

Another object of the present invention is to provide a method whereby complete electronic components and circuit arrangements are produced through successive printing operations performed in high-speed printing presses of conventional form.

Yet another object of the present invention is to provide a method for producing substantially reliable electronic components and circuits.

Still another object of the present invention is to provide electronic components and circuits at a cost whereby they may be economically discarded, in lieu of repair, in the event of subsequent failure during operation.

A further object of the present invention is to provide a method for producing a electronic components and circuits, of the character described, which require no substantial investment in initial and operating equipment.

A still further object of the present invention is to provide a method for producing automatically electronic components and circuits which are economically suitable for small-quantity production.

Numerous other objects and advantages of the present invention will become apparent from the following detailed description, which, taken in conjunction with the annexed drawings, discloses a preferred embodiment thereof.

SUMMARY OF THE INVENTION

The foregoing objects are achieved by printing with resistive conducting, dielectric, and semi-conducting inks upon a suitable substrate. To form a resistor, for example, resistive ink is used to print a configuration or design which results in the desired resistance characteristics. A capacitor may be produced by forming one electrode thereof with conductive ink upon a substrate. In a second printing process, dielectric ink is used to print directly over the first electrode in the form of a dielectric film. The second electrode is formed subsequently by printing again with conductive ink, directly upon the dielectric film. An inductor is generated by printing with conductive ink upon the substrate so that a spiral configuration is established. Interconnections or interconnecting leads are readily formed by printing with conductive ink within properly confined areas. Circuit isolation may be readily achieved through blanking operations performed in a punch press which generates slits through the respective films and the substrates. The inclusion of a drying process, in the manufacturing method, is often desirable to assure that each printed film is dry before a subsequent film is applied over its surface. As used herein, the term drying includes both evaporation as in the case of volatile solvents and curing as in the case of epoxies. In this manner, interaction and modification of the characteristics of the films may be avoided.

BRIEF DESCRIPTION OF THE DRAWING

Referring to the drawing.

DESCRIPTION OF THE PREFERRED EMBODIMENTS

Figures 1, 2:
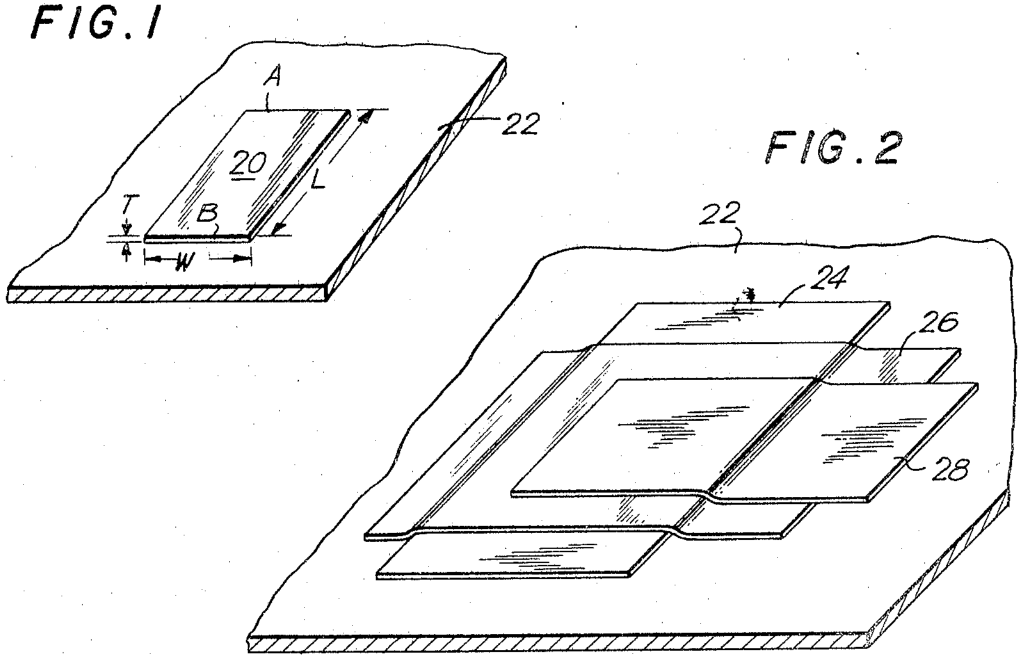
FIGURE 1 is a perspective view showing the construction of a printed resistor.
FIGURE 2 is a perspective view showing the multilayer printed construction of a capacitor.

As a preferred or exemplary embodiment of the instant invention, FIGURE 1 shows a resistor 20 that may be obtained by printing with resistive ink upon a suitable substrate 22. The magnitude of the resistor 20 is determined by the resistivity property of the printing ink, the thickness of the printed film, and the dimensions W and L. Specifically, the magnitude of the resistor 20 between A and B is proportional to the length L divided by the cross-sectional area of the film given by the product of T and W. The resistivity of the printed ink is the proportionality constant. By printing an appropriate configuration, therefore, it is possible to realize a resistor of the desired magnitude. The substrate 22 may be of non-conducting material such as plastic, paper, or phenolic compounds. The resistive ink, on the other hand, may have a carbon base, a zinc or a silicate base. The printing process may be accomplished through any of the commonly known methods involving flexographic, rotogravure, or letterpress equipment. In practice, the thickness of the film T may be within the range of 0.05 to 0.7 mil. It is not essential that the resistor 20 have a rectangular structure as shown in FIGURE 1. Any desired pattern may be printed to realize the desired results. Thus, the width of the film may be varied as a function of the length of the film and thereby simulate a functional or functionally wound resistor. An estimate of the size of the printed configuration may be obtained by noting that the printed ink has a surface-resistance value within the range of 2000 to 6000 ohms per square inch or higher.

The thin film structure of a capacitor is shown in FIGURE 2. A conductive film is first printed upon the substrate 22. This operation is similar to that described for the resistor 20, with the exception that ink having good conductive properties rather than resistive properties is used. Thus, the printing ink for the film 24 may have silver, copper, zinc, gold, platinum, palladium, rhodium, or alloys thereof as its base. Silver and the metallic compounds have excellent conducting properties. The thickness of the film 24 may be approximately 0.05 to 1.0 mil with 0.2 to 0.3 mil preferred.

The next step for generating the capacitor involves the printing of a dielectric film 26 upon the conductor film 24. The ink used for printing the dielectric film 26 may be of barium titanate, titanium dioxide, or other well-known dielectric materials. These compounds have excellent insulating properties, high dielectric constants and, accordingly, they are good dielectrics for application to capacitors. To complete the capacitor, a second conductive film 28 is printed upon the dielectric film 26. The properties of the conductive film 28 are similar to those of the film 24. The thickness of the dielectric film 26, for example, may be within the range of 0.05 to 0.5 mil.

The construction of the capacitor, shown in FIGURE 2, includes all the design principles that apply to the common capacitor. For example, a capacitor, as known in the art, possesses two conducting electrodes or plates separated by a dielectric substance. FIGURE 2 corresponds precisely to this arrangement. To prevent leakage of the capacitor, the dielectric film 26 should be printed well over the film 24, in a manner shown by the curved overlapping edges of the film. The conductive film 28, however, should be printed well within the area occupied by the dielectric film 26. In this manner, considerable linear insulating distance resides between the edges of the conductive films 24 and 28. If, for example, the distance is approximately greater than 0.01 inch, an effective insulating path prevails along the surface of the dielectric, and leakage between the conductive plates 24 and 28 is, thereby, inhibited. Printed capacitors of this type may provide capacitance values up to 10,000 mmf. per square inch or higher.

Figure 3:
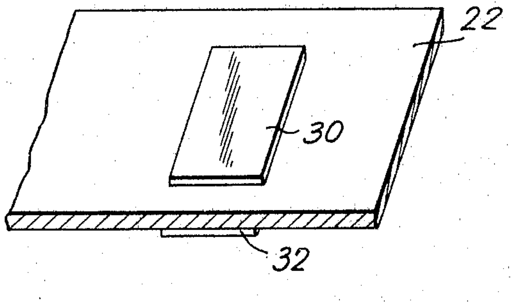
FIGURE 3 is a perspective view showing the arrangement for a printed capacitor, with the substrate of the printed circuitry serving also as the dielectric for the capacitor.

FIGURE 3 shows how a capacitor may be obtained by printing directly on both sides of the substrate. Thus, conductive films 30 and 32 are printed on opposite sides of the substrate 22 which serves as the dielectric for the capacitor. In this embodiment, the substrate may be made of plastic, barium titanate in plastic, glass, mica, paper, phenolic or ceramic compounds. The printing ink for the films 30 and 32 is similar to that used for films 24 and 28 in FIGURE 2, and is applied in a similar fashion. By utilizing the substrate 22 as the dielectric of the capacitor, a separate printing operation for the dielectric is avoided.

Figure 4:
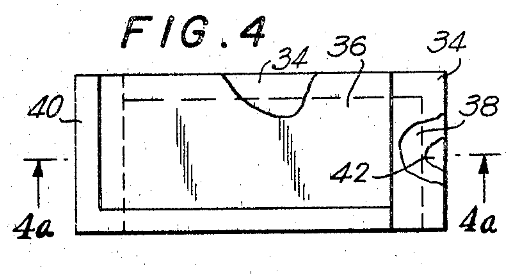
FIGURE 4 is a plan view of a capacitor configuration.
Figure 4A:
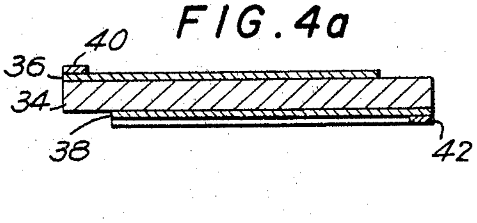
FIGURE 4*a* is a cross-sectional view taken substantially along line 4*a*—4*a* of FIGURE 4.

The electrodes of a capacitor are, generally, made of a conductive material, such as silver in certain networks. Metallic silver is, however, a costly material and, for this reason, it is desirable to evolve a capacitor design which would utilize the least possible amount of silver. Such a design resides in the construction of the embodiment illustrated in FIGURES 4 and 4*a*. In this embodiment, a substantially planar dielectric layer 34 is sandwiched by two printed resistive films 36 and 38. These resistive films are printed onto the surfaces of the dielectric layer 34 in the manner described hereinbefore. After the printing of the restrictive films 36 and 38 has been completed, lines of silver 40 and 42 are printed upon the surfaces of the resistive films 36 and 38. With the silver or conductive lines or strips 40 and 42 applied as shown in FIGURES 4 and 4*a*, capacitor losses, due to the resistance of the films 36 and 38, are reduced to a minimum. Thus, with the application of the lines or strips 40 and 42, the capacitor does not substantially have more losses than a capacitor with pure metallic or conductive electrodes. Accordingly, the design of the capacitor, in accordance with this embodiment, incurs a considerable saving in the amount of silver used for the electrodes.

Figure 5:
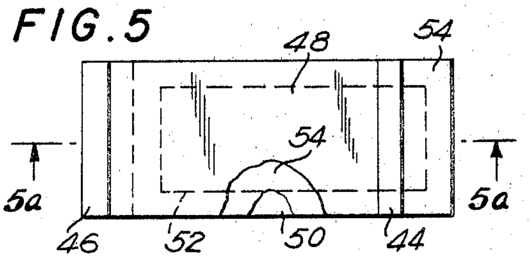
FIGURE 5 is a plan view of a distributed resistor-capacitor network configuration.
Figure 5A:
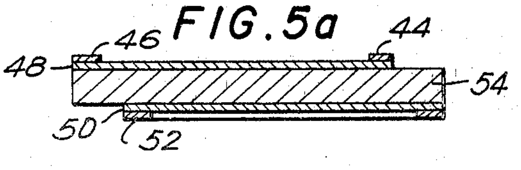
FIGURE 5*a* is a cross-sectional view taken substantially along line 5*a*—5*a* of FIGURE 5.

Through a simple variation in the design of the preceding embodiment, a distributed resistor-capacitor network may be realized. The construction of such a network is shown in FIGURES 5 and 5*a*. In this embodiment, resistive films 48 and 50 are printed upon a dielectric layer 54, in a fashion similar to that described for the construction corresponding to the embodiment of FIGURES 4 and 4*a*. The lower conductive strip or lines 52 is printed upon the resistor film 50 so as to form one electrode of the capacitior. The upper resistive film 48, however, has printed upon it two strips or lines 44 and 46 spaced from each other. These spaced strips are made of conductive materials similar to that used for the strip 52 or the strips 40 and 42, described supra. As a result of the spacing of the strips 44 and 46, a resistive element prevails between these strips.

Figure 6:
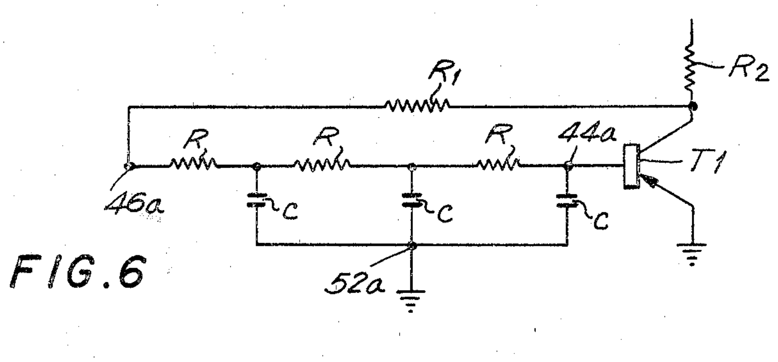
FIGURE 6 is an electrical schematic diagram of the equivalent circuit of the distributed resistor-capacitor network of FIGURE 5, as well as an application of this network to an oscillator.

The equivalent circuit of this distributed network is shown in FIGURE 6. The latter shows the network when applied in conjunction with a transistor T1 to form an oscillator circuit. In this configuration, the component of FIGURE 5*a* is connected into the circuit so that the elements 44, 46 and 52 form the junctions 44*a*, 46*a*, and 52*a*, respectively, Thus, the component of FIGURE 5*a* is equivalent to three resistors each of magnitude R and three capacitors each of magnitude C. The distributed parameter network contained within the single component of FIGURE 5*a*, therefore, incurs a very considerable saving in individual electrical components.

Figure 7:
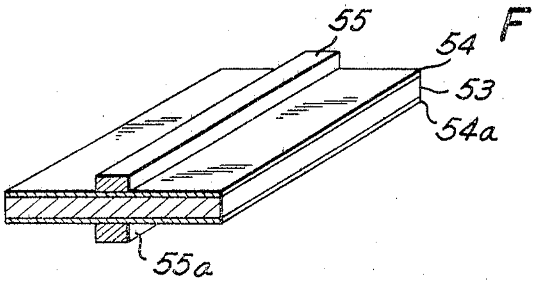
FIGURE 7 is a perspective view of another printed capacitor configuration.

In an alternate printed capacitor structure, shown in FIGURE 7, a substantially planar dielectric layer 53 is sandwiched between two printed resistive films 54, 54*a*. These resistive films 54, 54*a*, of carbon-filled plastic, are printed onto the surfaces of the dielectric layer 53 in the manner described hereinbefore.

Thereafter, conductive metal electrodes 55, 55*a* of appropriate configuration are secured to the respective resistive films 54, 54*a* by appropriate means such as an adhesive compatible with the carbon-filled plastic. Thus, the electrodes 55, 55*a* may be aluminum or magnesium solid metal strips in addition to printed silver lines as shown in FIGURE 4. This construction will reduce capacitor losses considerably. Electrical connections may be made to the electrodes 55, 55*a*.

The preceding techniques that may be employed for producing capacitors are also applicable to the manufacture of tubular type of capacitors. In the commonly known art, the tubular unit is produced by laminating aluminum foil to each side of a long Mylar strip and rolling the combined structure tightly into a tubular form.

Figure 8:
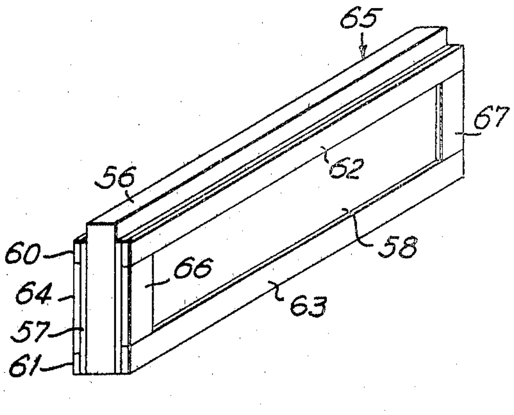
FIGURE 8 is an isometric view showing the arrangement whereby a printed capacitor may be fabricated in tubular form.

A considerably lower-cost unit may be produced with the aid of the printing processes in accordance with the present invention. FIGURE 8 shows an embodiment whereby a low-cost tubular capacitor may be produced. In lieu of the aluminum foil, resistive layers of ink may be printed upon the dielectric 56. These resistive ink layers are represented by the elements 57 and 58 in FIGURE 8. Silver lines 60, 61, 62 and 63 may then be printed upon the resistive films 57 and 58 so as to form a loss-less capacitor. Lines 60, 61 are joined at both ends by conductors 64, 65 while lines 62, 63 are joined at both ends by similar conductors 66, 67. The printed layers of film may afterwards be tightly rolled to form the required tubular product. Electrical connections are made to the conductive frame 60, 61, 64, 65 and to frame 62, 63, 66, 67. Tubular capacitors having values of the order of 0.1 microfarad may be readily achieved through this process.

A distributed parameter network may be realized with the construction of FIGURE 8, if the silver lines 60, 61 on film 57 are made very thin. Lines 62, 63 are wide enough to give a low-loss electrode on film 58. Similar results for a distributed parameter network may be realized if, instead, these silver conductive lines are broken or interrupted at predetermined intervals. Electrical connections are made to the frame 62, 63, 66, 67 and to the conductors 64, 65. The network may also be rolled to tubular form.

Figure 9:
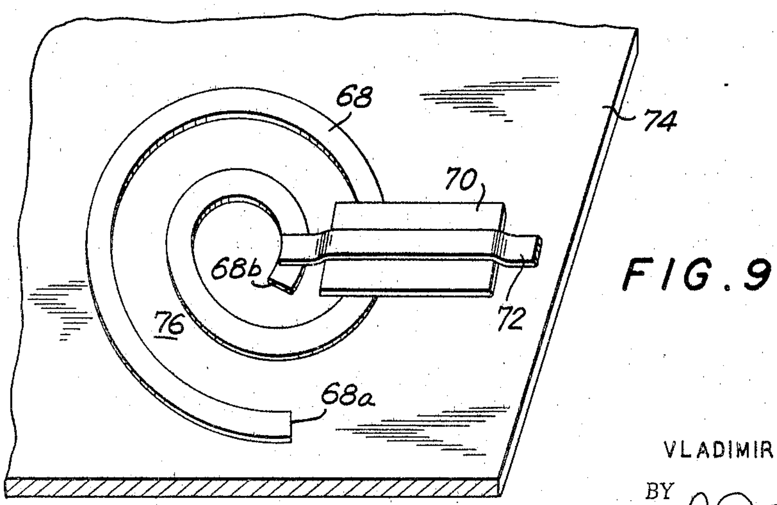
FIGURE 9 is a perspective view showing the detailed construction of a printed inductor.

A printed inductive component may be obtained by resorting to the construction of FIGURE 9. A spiral 68 is printed upon a suitable substrate 74 with conductive ink. This spiral is an analog of a wound coil and, when properly designed, will provide the proper inductive reactance. Thus, the reactance of the component of FIGURE 9 is a function of the number of turns in the spiral and the frequency. The spacing of the turns within the spiral is also a determining factor. The two terminals of the inductor correspond to the end portions of the coils 68*a* and 68*b*.

To connect a printed conductive lead 72 to the portion 68*b*, at the center of the spiral, it is essential to interpose a printed film or layer 70 of insulating material between the lead 72 and all the turns of the spiral crossed by the lead. The film 70 is generated by printing with insulating ink. This insulating film is necessary to prevent short-circuiting of the spiral by the lead 72.

The inductance of the component may be substantially increased by printing a ferrite film between turns of the spiral corresponding to the area 76. Such a ferrite film is analogous to the iron core commonly used in inductors. Satisfactory results may be realized if the thickness of the spiral film exceeds approximately 0.1 mil. The insulating film 70 may be approximately 0.3 mil in thickness. The lead 72 is electrically joined to the end portion 68*b*, and may have a film thickness exceeding approximately 0.1 mil.

In order to assure that the printed films do not interfere with each other and remain electrically isolated from each other, it may be desirable to ascertain that each printed film is completely dry before another film is printed thereover. Without such a drying process, it is possible that when the films are printed on each other while they are still in the wet state, the properties of each of the films will be affected in an undesirable manner. Thus, if the films are printed over each other while in the wet state, the different inks of the films may intermix and alter thereby the properties of the parent film. In certain instances, such as for making electrical connections with a low ohmic contact, some degree of interaction may be desirable.

Figure 10:
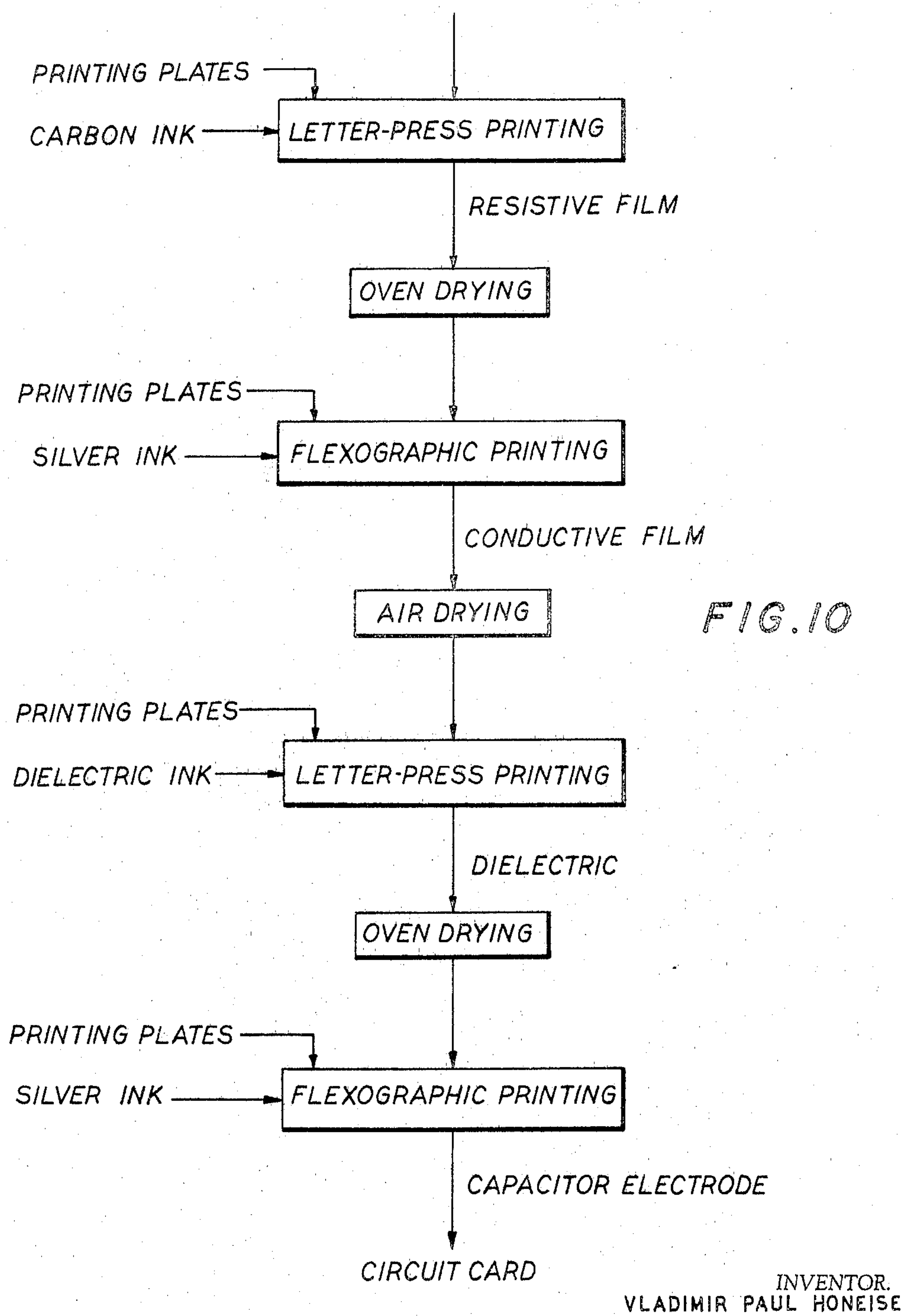
FIGURE 10 is a process flow diagram showing the steps for fabricating a printed network through techniques involving conventional printing equipment.

A summary of the processes involved in producing a typical resistor-capacitor network is illustrated in FIGURE 10. In the first step of the process, a letterpress, for example, is used to print a resistive film with carbon ink upon a suitable substrate. This printed resistive film is then dried in an oven before the next printing process is applied. Silver ink applied by means of the flexographic printing process, for example, then produces a conductive film which forms connections between circuit elements and also one electrode of a capacitor. The silver conductive film may then be air-dried before proceeding further. After the conductive film has been properly dried, the dielectric element of the capacitor may be generated in a letterpress with dielectric ink. The printed dielectric film is then dried in an oven. Upon emerging from the oven, the flexographic printing process may be applied again to print the silver ink and form, thereby, the second electrode of the capacitor. With this last step in the manufacturing process, the resistor-capacitor network is completed and forms, together with the substrate, a circuit part.

Figure 11:
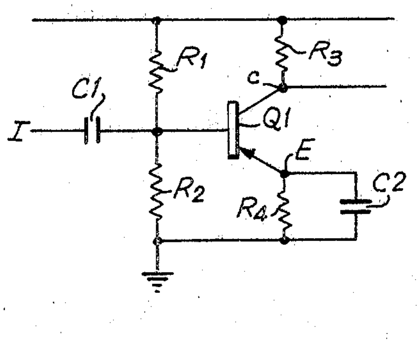
FIGURE 11 is an electrical schematic diagram of a typical circuit applied in the electronics industry.
Figure 11A:
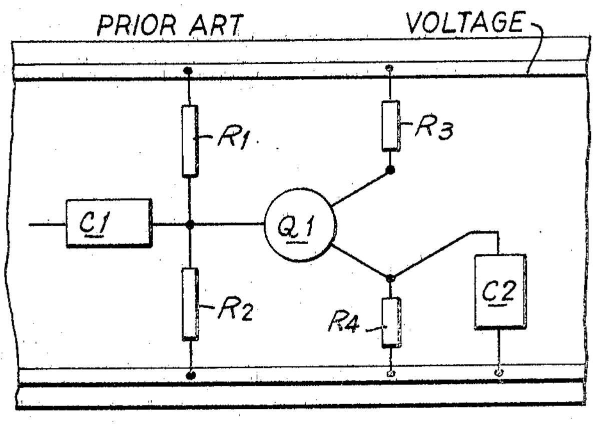
FIGURE 11*a* is a plan view showing the layout and fabrication of the circuit of FIGURE 11 through conventional electronic components.
Figure 11B:
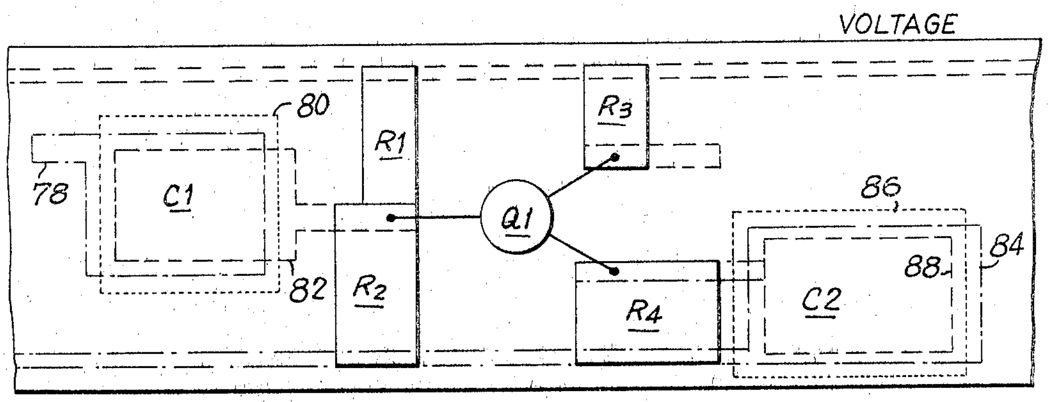
FIGURE 11*b* is a plan view of the construction of the circuit of FIGURE 11, through printed circuit techniques, in accordance with the present invention.

The manner in which the preceding printed components are combined to form and function within a complete circuit is illustrated by FIGURES 11, 11*a*, and 11*b*. FIGURE 11 shows the equivalent circuit which is to be generated by a series of printing processes. FIGURE 11*a* shows the conventional method whereby the circuit of FIGURE 11 would be produced with components commonly known in the art. Thus, the tubular components comprising resistors and capacitors are interconnected by solid wire conductors to a transistor Q1.

The method for producing the required circuit in accordance with the present invention, however, is shown in FIGURE 11*b*. All of the components, with the exception of the transistor, and their interconnections may be generated through the application of only four printing processes. For example, in the first printing process, the conductive electrodes 78 and 84 of the capacitors C1 and C2, respectively, are generated. The ground electrode or ground terminal is also formed in this first printing process. This first printing process is illustrated by dash-dot lines in FIGURE 11*b*. During the second printing, illustrated by dotted lines, the dielectrics 80 and 86 of capacitors C1 and C2, respectively, are formed. The third printing, represented by solid lines, is performed with resistive ink, and forms all of the resistors of the circuit, i.e., R1, R2, R3, and R4. During the fourth printing process, conductive ink is used again, as in the first process, to generate the second electrodes 82 and 88 of the capacitors C1 and C2, respectively. During this last printing process, illustrated by dashed lines, the conductive ink is also applied to form all interconnections between components as well as all terminals thereon. Thus, the interconnections between the various resistors and the capacitors are generated during this process, as well as the conductive strip to which the negative voltage supply is applied.

The transistor Q1 is connected to the printed components, using conductive cement or other suitable means, to form the completed circuit.

Figure 12:
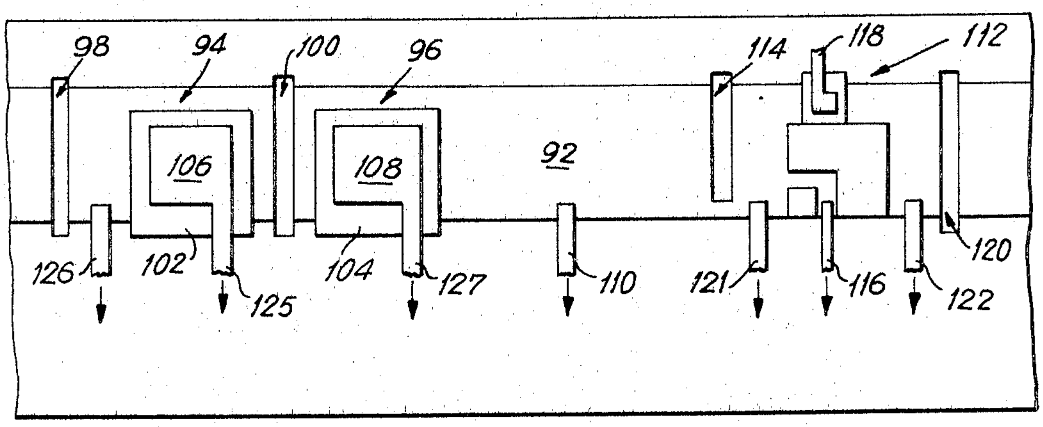
FIGURE 12 is a plan view showing isolating and grounding techniques for printed circuitry in accordance with the present invention.

In a number of cases it may be desirable to use metallic foil as one electrode of a capacitor, as a ground plane, or as a base for forming high-frequency inductors. FIGURE 12 illustrates the manner whereby such a design may be produced. Aluminum foil 92 is laminated to a suitable substrate 90 in the form of paperboard, plastic, or the like. The process of laminating aluminum foil to such substrate materials is readily performed and commonly known in the art. The insulating substrate 90 has printed upon it the passive electronic components required for a particular circuit. The substrate may also contain non-printed components as may be required in the circuit.

For purposes of isolating the circuits from each other, it is necessary to slit or etch the aluminum from the surface of the substrate. A simple manner in which to achieve the same results is to apply a punch press for blanking or cutting out specific areas or slots in both the aluminum foil and the substrate. These punched or blanked-out areas are illustrated in FIGURE 12, and show how they function in an isolating manner. For example, the coupling capacitor 94 is isolated from the by-pass capacitor 96 through the slots 98 and 100. These two capacitors 94 and 96 are formed by denoting that the aluminum foil, acting as the ground plane, be also an electrode of each of the capacitors. Through the use of dielectric ink, the dielectric films 102 and 104 are printed upon the aluminum. Conductive films 106 and 108 are subsequently printed upon the dielectrics 102 and 104, respectively, to form the second electrodes of the capacitors 94 and 96, respectively. The printed conductive strip 110 permits the connecting of the aluminum foil to ground potential, while leads 125, 126 permit connection of coupling capacitor 94 to the circuits.

The connection of aluminum 92 to a substrate 90 is also very useful in the forming of a high-frequency inductor 112. The ground end of this inductor is left connected to the ground plane 92 by not extending the blanked-out slot 114 along the entire width of the aluminum foil 92. The taps 116 and 118 are inductor and capacitor taps, respectively. Through the use of the ground plane, in this manner, a low-loss inductor may be formed for very high-frequency application. The slot 120 serves, further, to isolate the inductive circuit from other circuits that may be printed to the right of the slot. The terminals 122 and 124 may be used to interconnect the inductive circuit 112 with other circuits mounted or printed upon the substrate 90, in the desired manner.

Obviously, the different printing inks used to obtain the desired electrical characteristics may have a variety of ingredients and compositions. Such ink or coating compositions are well-known in the art and do not form a part of this invention.

It is thought that the invention and many of its attendant advantages will be understood from the foregoing description and it will be apparent that various changes may be made in the form, construction, and arrangement of parts and that changes may be made in the steps of the method described and in their order of accomplishment without departing from the spirit and scope of the invention or sacrificing all of its material advantages, the form hereinbefore described being merely a preferred embodiment thereof.

I claim:

1. A capacitor, comprising:
- a dielectric layer of substantially planar configuration;
- a thin printed electrically resistive film upon each of the opposed surfaces of said dielectric layer; and
- a plurality of narrow lines of higher conductivity than said resistive film extending in at least two angularly-related directions upon the surfaces of said resistive films whereby the electrode losses due to the resistance of said resistive films, are minimized while said component utilizes minimal conductive material.

2. The capacitor of claim 1 wherein said resistive film comprises a carbon.

3. The capacitor of claim 1 wherein said conductive lines comprise a metal selected from the group consisting of silver, gold, platinum, copper, palladium, and rhodium.

4. A distributed resistor-capacitor network comprising:
- a dielectric layer of substantially planar configuration;
- a thin printed electrically resistive film upon each of the opposed surfaces of said dielectric layer;
- directly connected conductive lines forming a ground electrode on one of said film surfaces; and
- two mutually spaced printed thin conductive lines on the other of said film surfaces and connected only by said resistive film.

References Cited

UNITED STATES PATENTS

| | | | |
|---|---|---|---|
| 2,694,185 | 11/1954 | Kodama. | |
| 2,776,235 | 1/1957 | Peck | 117—212 XR |
| 2,993,266 | 7/1961 | Berry. | |
| 3,032,443 | 5/1962 | Short | 117—212 |
| 3,060,062 | 10/1962 | Katz | 117—212 |
| 3,114,868 | 12/1963 | Feldman | 317—258 |
| 3,267,342 | 8/1966 | Pratt et al. | 317—261 XR |
| 3,302,080 | 1/1967 | Dauger et al. | 317—261 XR |
| 3,303,550 | 2/1967 | Banzhof | 317—258 |

OTHER REFERENCES

"Printed Circuit Techniques," National Bureau of Standards Circular 468, Nov. 15, 1947, pp. 12–13.

ROBERT K. SCHAEFER, Primary Examiner

J. R. SCOTT, Assistant Examiner

U.S. Cl. X.R.

117—212; 317—242, 258; 336—208